United States Patent
Vasquez et al.

(10) Patent No.: US 8,413,010 B1
(45) Date of Patent: Apr. 2, 2013

(54) DATA STORAGE DEVICE EMPLOYING HIGH QUALITY METRICS WHEN DECODING LOGICAL BLOCK ADDRESS APPENDED TO A DATA SECTOR

(75) Inventors: Steven R. Vasquez, Rancho Santa Margarita, CA (US); Patrick J. Lee, San Jose, CA (US)

(73) Assignee: Western Digital Technologies, Inc., Lake Forest, CA (US)

( * ) Notice: Subject to any disclaimer, the term of this patent is extended or adjusted under 35 U.S.C. 154(b) by 1056 days.

(21) Appl. No.: 12/403,257

(22) Filed: Mar. 12, 2009

(51) Int. Cl.
*H03M 13/00* (2006.01)
*G11C 29/00* (2006.01)

(52) U.S. Cl. .................... 714/758; 714/764; 714/795

(58) Field of Classification Search .................. 714/764, 714/746, 758, 795
See application file for complete search history.

(56) References Cited

U.S. PATENT DOCUMENTS

| | | | |
|---|---|---|---|
| 5,661,848 A | 8/1997 | Bonke et al. | |
| 6,125,469 A * | 9/2000 | Zook et al. | 714/769 |
| 6,757,122 B1 | 6/2004 | Kuznetsov et al. | |
| 6,757,864 B1 * | 6/2004 | Hansquine | 714/794 |
| 7,089,479 B2 | 8/2006 | Matsumoto | |
| 7,239,547 B2 * | 7/2007 | Suda | 365/185.09 |
| 7,245,236 B2 | 7/2007 | Izumita et al. | |
| 7,272,770 B2 | 9/2007 | Matsumoto | |
| 7,395,495 B2 | 7/2008 | Jacobsen | |
| 7,418,645 B2 | 8/2008 | Srivastava | |
| 7,447,972 B2 | 11/2008 | Kim et al. | |
| 7,454,685 B2 | 11/2008 | Kim et al. | |
| 7,876,860 B1 * | 1/2011 | Varnica et al. | 375/340 |
| 8,027,401 B2 * | 9/2011 | Hwang et al. | 375/267 |
| 2006/0156199 A1 | 7/2006 | Palanki et al. | |
| 2007/0086106 A1 * | 4/2007 | Hashimoto et al. | 360/75 |
| 2007/0220402 A1 * | 9/2007 | Hagi et al. | 714/766 |
| 2007/0288833 A1 * | 12/2007 | Djurdjevic et al. | 714/784 |
| 2008/0115036 A1 * | 5/2008 | Kuznetsov et al. | 714/758 |
| 2011/0194205 A1 * | 8/2011 | Kim et al. | 360/53 |

OTHER PUBLICATIONS

Wei Zhang, Claude D'Amours, and Abbas Yonga\&\#231;o\ &\#487;lu. 2005. Adaptive iterative soft-input soft-output parallel decision-feedback detectors for asynchronous coded DS-CDMA systems. EURASIP J. Wirel. Commun. Netw. 2005, (Apr. 2, 2005), 155-162.*
IEEE 100 The Authoritative Dictionary of IEEE Standards Terms Seventh Edition by the Institute of Electrical and Electronics Engineers, Inc. Published Dec. 2000.*
Bastug et al., "Improving the Payload of Watermarking Channels via LDPC Coding", IEEE Signal Processing Letters, vol. 11, No. 2, Feb. 2004, pp. 90-92.
David Chase, "A Class of Algorithms for Decoding Block Codes With Channel Measurement Information", IEEE Transactions on Information Theory, vol. IT-18, No. 1, Jan. 1972, pp. 170-182.
Jack K. Wolf, "Efficient Maximum Likelihood Decoding of Linear Block Codes Using a Trellis", IEEE Transactions on Information Theory, vol. IT-24, No. 1, Jan. 1978, pp. 76-80.

* cited by examiner

*Primary Examiner* — Cynthia Britt

(57) ABSTRACT

A data storage device is disclosed that receives a read command from a host, wherein the read command comprises a read logical block address (LBA_R). A target data sector is read in response to the LBA_R to generate a read signal. The read signal is processed to detect user data and redundancy data using a soft-output detector that outputs quality metrics for the user data and redundancy data. A high quality metric is assigned to the LBA_R, and errors are corrected in the user data using an error correction code (ECC) decoder in response to the quality metrics output by the soft-output detector and the quality metrics assigned to the LBA_R.

24 Claims, 8 Drawing Sheets

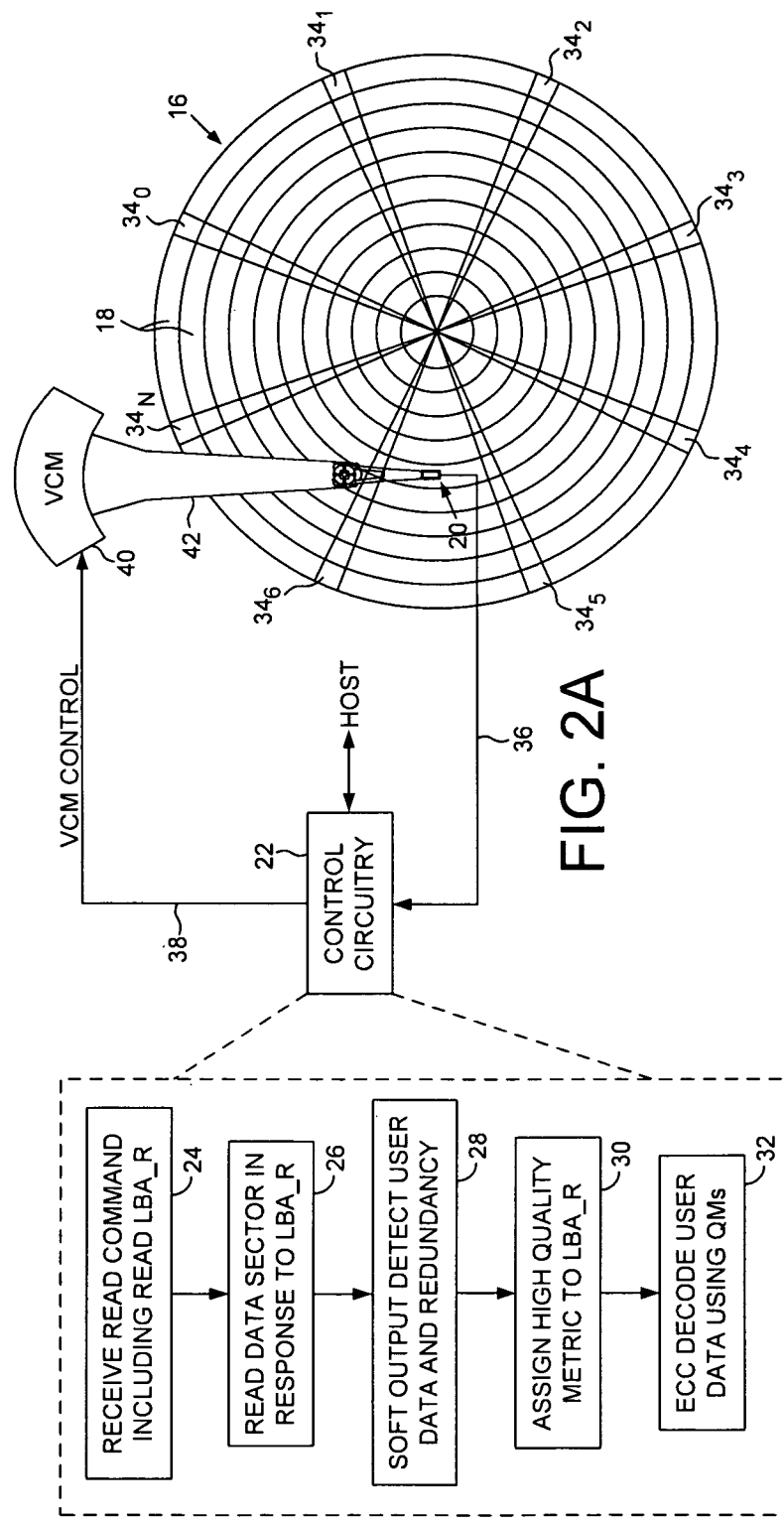

DATA STORAGE DEVICE EMPLOYING HIGH QUALITY METRICS WHEN DECODING LOGICAL BLOCK ADDRESS APPENDED TO A DATA SECTOR

BACKGROUND

Description of the Related Art

Computer systems (e.g., desktops, laptops, portables, etc.) typically employ some form of a non-volatile data storage device such as a disk drive, or a solid state drive comprising a non-volatile semiconductor memory such as flash memory. A solid state drive typically emulates a disk drive so that the same communication protocol may be employed. That is, a host typically interfaces with a solid state disk drive using a standard disk drive communication protocol, such as the Advanced Technology Attachment (ATA) protocol.

When manufacturing a conventional disk drive, servo sectors $2_0$-$2_N$ are written to a disk 4 which define a plurality of radially-spaced, concentric data tracks 6 as shown in the prior art disk format of FIG. 1. Each data track 6 is partitioned into a plurality of data sectors wherein the servo sectors $2_0$-$2_N$ are considered "embedded" in the data sectors. Each servo sector (e.g., servo sector $2_4$) comprises a preamble 8 for synchronizing gain control and timing recovery, a sync mark 10 for synchronizing to a data field 12 comprising coarse head positioning information such as a track number, and servo bursts 14 which provide fine head positioning information. The coarse head position information is processed to position a head over a target track during a seek operation, and the servo bursts 14 are processed to maintain the head over a centerline of the target track while writing or reading data during a tracking operation.

The ever increasing complexity of the control programs to coordinate the numerous components of the disk drive increases the probability of a programming error resulting in the wrong data being transferred to the host during read operations or written to the disk during write operations. To help protect against transferring bad data to the host, prior art disk drives have implemented "data path protection" techniques wherein the logical block address (LBA) received from the host during a write operation is used to encode error detection code (EDC) data that are appended to the corresponding data sector written to the disk. Alternatively, the host may use the LBA to encode the EDC data which is transmitted to the disk drive together with the user data for the write command. During a read operation of the data sector, the disk drive may generate check data using the LBA received from the host to verify the integrity of the read data, and/or the host may generate check data using the LBA to verify the integrity of the read data once received. If the check data does not match the EDC data appended to the data sector, an error condition is triggered.

BRIEF DESCRIPTION OF THE DRAWINGS

FIG. 2A shows a disk drive according to an embodiment of the present invention comprising a disk, a head actuated over the disk, and control circuitry.

FIG. 2B is a flow diagram executed by the control circuitry wherein high quality metrics are assigned to a read logical block address (LBA_R) when correcting a data sector using an error correction (ECC) code decoder.

DETAILED DESCRIPTION OF EMBODIMENTS OF THE INVENTION

Figure 1:
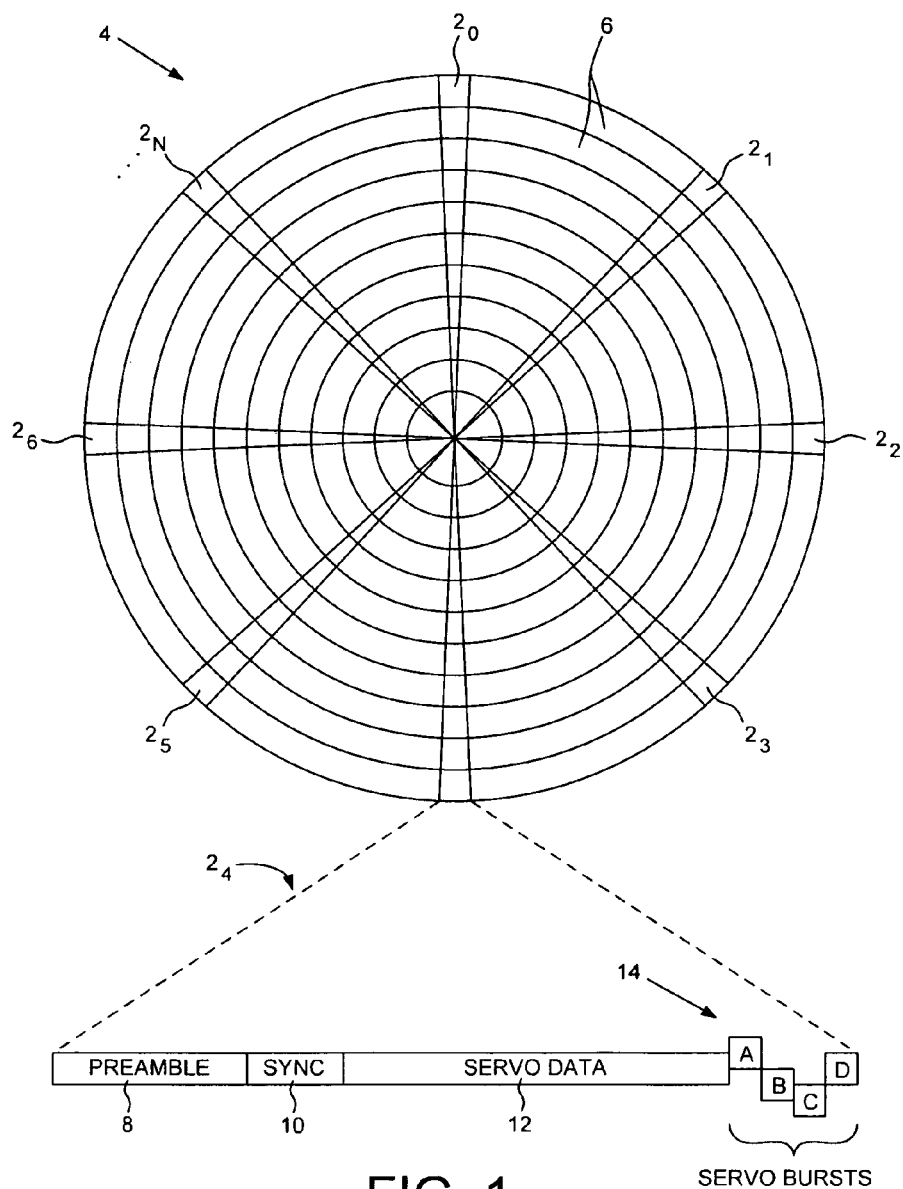
FIG. 1 shows a prior art disk format comprising a plurality of concentric data tracks defined by embedded servo sectors.

FIG. 2A shows a disk drive according to an embodiment of the present invention comprising a disk 16 having a plurality of data tracks 18, wherein each data track comprises a plurality of data sectors. The disk drive further comprises a head 20 actuated over the disk 16 and control circuitry 22 for executing the flow diagram of FIG. 2B. A read command is received from a host (step 24), wherein the read command comprises a read logical block address (LBA_R). A target data sector is read in response to the LBA_R to generate a read signal (step 26). The read signal is processed to detect user data and redundancy data using a soft-output detector that outputs quality metrics for the user data and redundancy data (step 28). A high quality metric is assigned to the LBA_R (step 30), and errors are corrected in the user data using an error correction code (ECC) decoder in response to the quality metrics output by the soft-output detector and the quality metrics assigned to the LBA_R (step 32).

In the embodiment of FIG. 2A, the disk 16 comprises a plurality of servo sectors $34_0$-$34_N$ that define the plurality of data tracks 18. The control circuitry 22 processes the read signal 36 to demodulate the servo sectors $34_0$-$34_N$ into a position error signal (PES). The PES is filtered with a suitable compensation filter to generate a control signal 38 applied to a voice coil motor (VCM) 40 which rotates an actuator arm 42 about a pivot in order to position the head 20 radially over the disk 16 in a direction that reduces the PES. The servo sectors $34_0$-$34_N$ may comprise any suitable position information, such as a track address for coarse positioning and servo bursts for fine positioning.

Figure 3A:
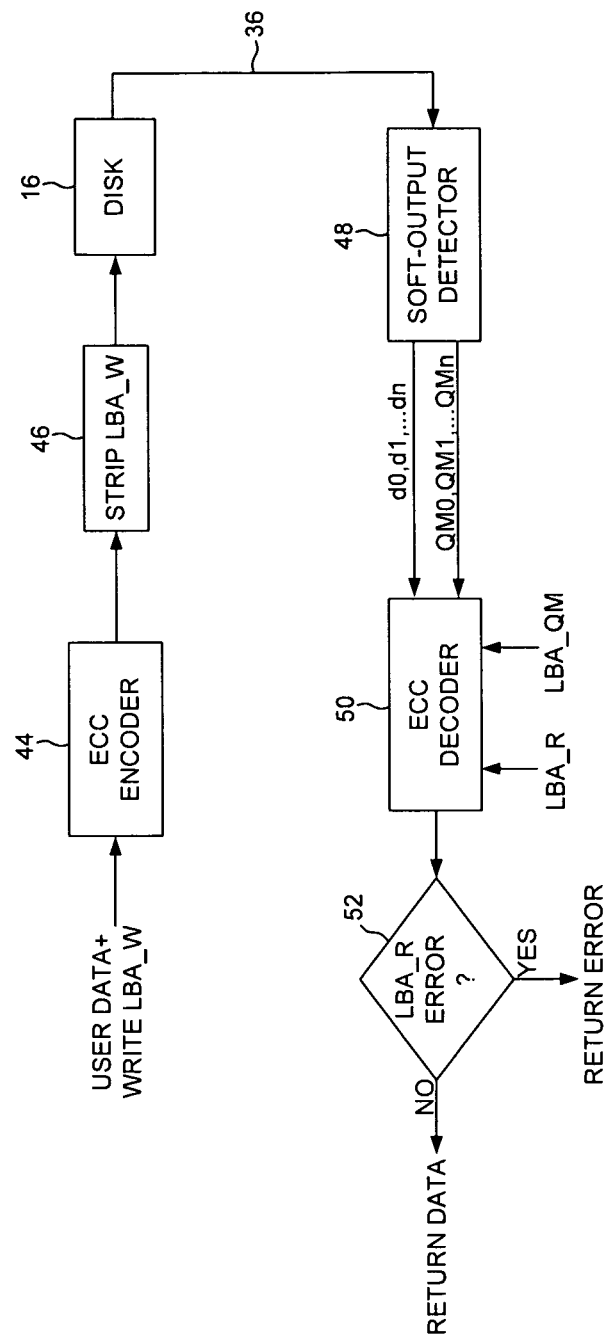
FIG. 3A shows control circuitry according to an embodiment of the present invention comprising a soft-output detector for generating quality metrics.

FIG. 3A shows control circuitry 22 according to an embodiment of the present invention for executing a write command to write user data to a data sector, and a corresponding read command to read the user data from the data sector. When the write command is received from the host, the write command includes the user data and a write logical block address (LBA_W) which identifies the target data sector to be written. An ECC encoder 44 encodes the user data and the appended LBA_W to generate redundancy data. The LBA_W is then stripped 46 from the resulting codeword and only the user data and redundancy data are written to the disk 16. When a corresponding read command is received to read the target data sector, the data sector is read to generate a read signal 36 processed by a soft-output detector 48 to detect the user data and redundancy data d0-dn as well as generate associated quality metrics QM0-QMn. An ECC decoder 50 processes the user data, the redundancy data, and the quality metrics using an iterative algorithm in order to correct errors in the user data. Since the redundancy data is also generated over the LBA_W during the write operation, during the read operation the read logical block address (LBA_R) received from the host is processed by the ECC decoder 50 together with quality metrics (LBA_QM) assigned to the LBA_R. After successfully correcting the user data, the control circuitry checks whether a correction was also made to the LBA_R 52. If a correction was made to the LBA_R in order to generate the LBA_W, then an error is returned to the host since the LBA_R does not match the LBA_W.

When initially attempting to recover the user data, high quality metrics (LBA_QM) are assigned to the LBA_R for processing by the ECC decoder 50. In this manner, the ECC decoder 50 will assume the LBA_R matches the LBA_W (no error in the LBA_R) and thereby focus the correction power of the ECC on the user data. In an embodiment described below, if the ECC decoder 50 is unsuccessful in correcting the user data using high quality metrics for the LBA_R, then the quality metrics are modified (e.g., set to a low value) and the ECC decoding re-executed.

Any suitable soft-output detector 48 may be employed in the embodiments of the present invention. In an embodiment shown in FIG. 3B, the soft-output detector comprises a suitable Viterbi detector 54 which outputs a quality metric for each symbol of the detected data sequence. Another suitable soft-output detector for generating quality metrics is the Bahl-Cocke-Jelinek-Raviv (BCJR) detector. Any suitable quality metric may be generated, wherein the quality metric represents a probability that the detected data symbol was accurately detected. An example quality metric is a log likelihood ratio (LLR), wherein a value of 0 may represent the lowest probability and a value of 1 may represent the highest probability. In one embodiment, the quality metrics associated with the LBA_R are initially set at or near the highest possible value (step 30 of FIG. 2B) indicating a high probability that there are no errors in the LBA_W (i.e., a high probability that the LBA_R will match the LBA_W).

Figure 3B:
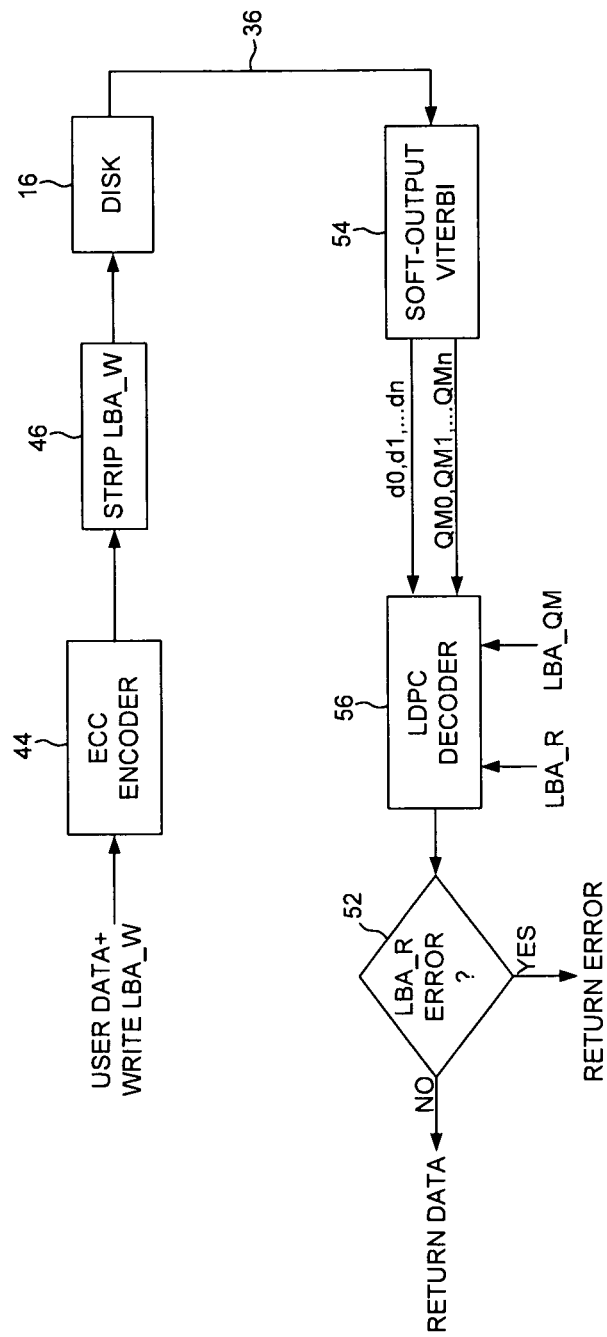
FIG. 3B shows an embodiment of the present invention wherein the soft-output detector comprises a Viterbi detector, and the ECC decoder comprises an iterative decoder in the form of a low-density parity-check (LDPC) decoder.
Figure 3C:
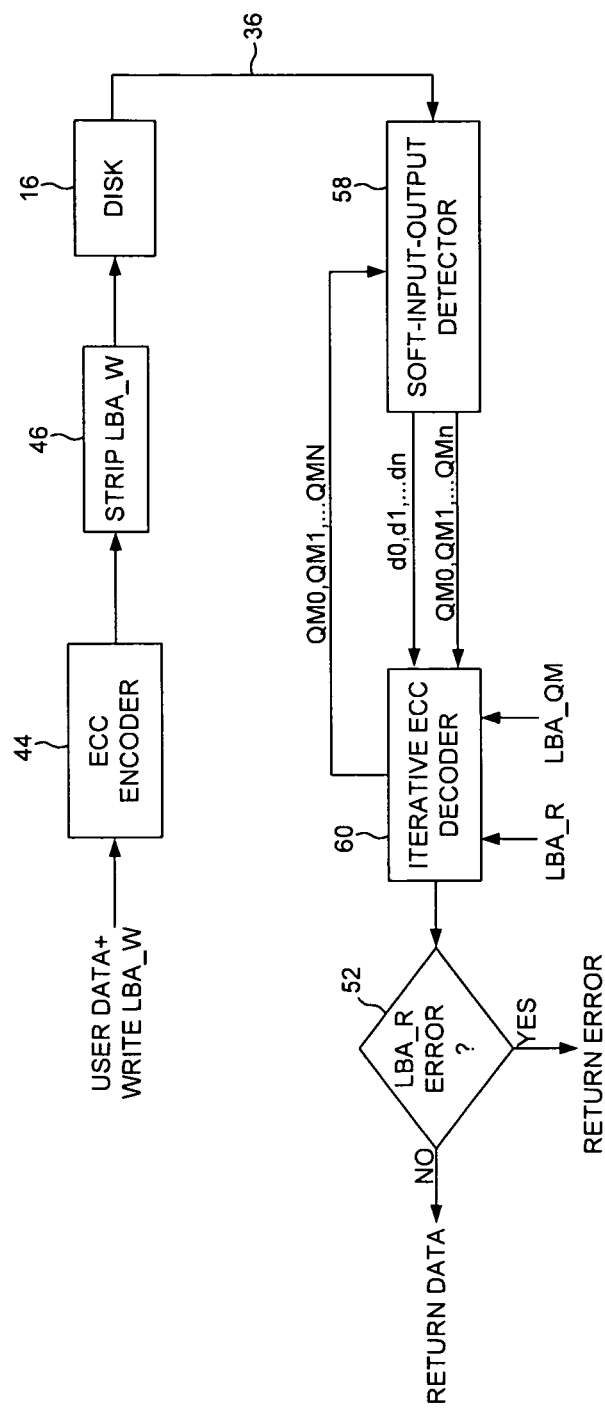
FIG. 3C shows an embodiment of the present invention wherein the soft-output detector comprises a soft-input-output detector for processing quality metrics output by an iterative ECC decoder.

Any suitable ECC decoder 50 capable of processing the quality metrics generated by the soft-output detector may be employed in the embodiments of the present invention. The ECC decoder 50 processes the redundancy data as well as the quality metrics output by the soft-output detector 48 in order to increase the likelihood of accurately recovering the user data as compared to a straight "binary" ECC decoder. In one embodiment, the ECC decoder 50 operates according to a trellis of a Viterbi algorithm wherein the quality metrics are evaluated as branch metrics. In another embodiment, the ECC decoder 50 comprises an iterative decoder such as a low-density parity-check (LDPC) decoder 56 as shown in the embodiment of FIG. 3B. An iterative ECC decoder processes the detected data in iterations, wherein after each iteration the quality metrics are updated. Typically an iterative decoder will either converge successfully, or "time out" after exceeding a predetermined number of iterations. In an embodiment shown in FIG. 3C, after each iteration the iterative ECC decoder 60 feeds back the updated quality metrics to a soft-input-output detector 58, such as a soft-input-output Viterbi detector or a Turbo Code detector. The soft-input-output detector 58 processes the updated quality metrics in order to improve the accuracy of the detected data sequence input into the iterative ECC decoder 60 for the next iteration.

Figure 4A:
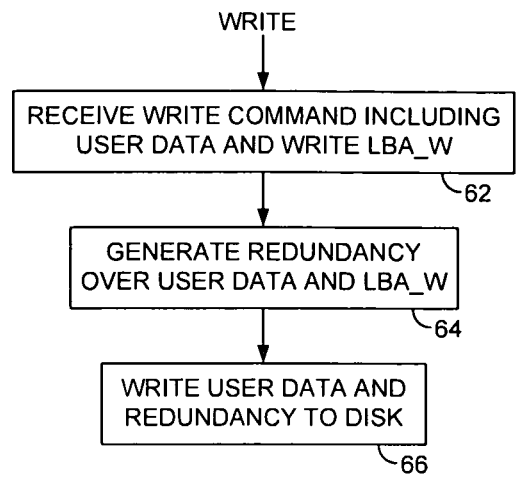
FIG. 4A is a flow diagram according to an embodiment of the present invention wherein a write logical block address (LBA_W) is encoded with user data into redundancy data written to a data sector.

FIG. 4A is a flow diagram according to an embodiment of the present invention wherein the control circuitry 22 receives a write command from the host including user data and a write logical block address (LBA_W) identifying one or more target data sectors (step 62). Redundancy data is generated over the user data and the LBA_W (step 64), and the user data and redundancy are written to the target data sector (step 66). The LBA_W may also be written to the target data sector and used to verify the accuracy of the LBA during a read operation by comparing the LBA_W read from the target data sector to the LBA_R received from the host during the read operation.

Figure 4B:
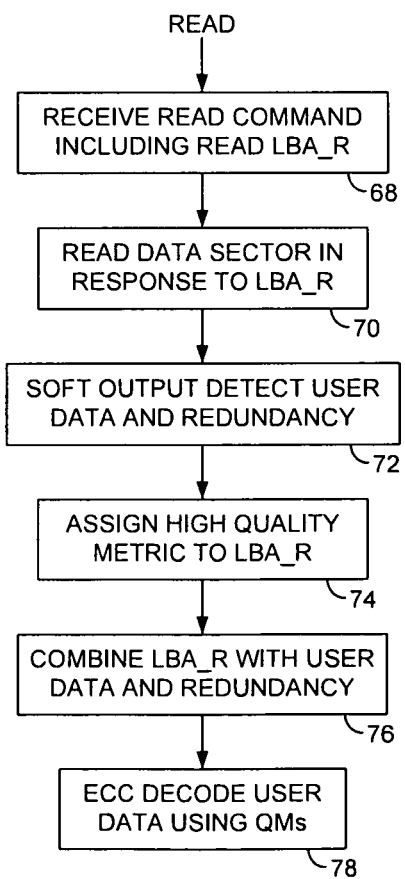
FIG. 4B is a flow diagram according to an embodiment of the present invention wherein a read logical block address (LBA_R) received from the host is used by the ECC decoder to decode a data sector read from the disk.

FIG. 4B is a flow diagram according to an embodiment of the present invention wherein the LBA_W is not written to the target data sector. The control circuitry 22 receives a read command from the host including a read logical block address (LBA_R) identifying one or more target data sectors (step 68). The target data sector identified by the LBA_R is read (step 70), and the read signal processed by a soft-output detector to detect the user data and the redundancy data and generate associated quality metrics (step 72). High quality metrics are assigned to the LBA_R (step 74) which is then combined with the user data and the redundancy data to form a codeword (step 76). The codeword is then decoded by an ECC decoder using the quality metrics associated with the user data, redundancy data, and LBA_R (step 78).

Figure 5:
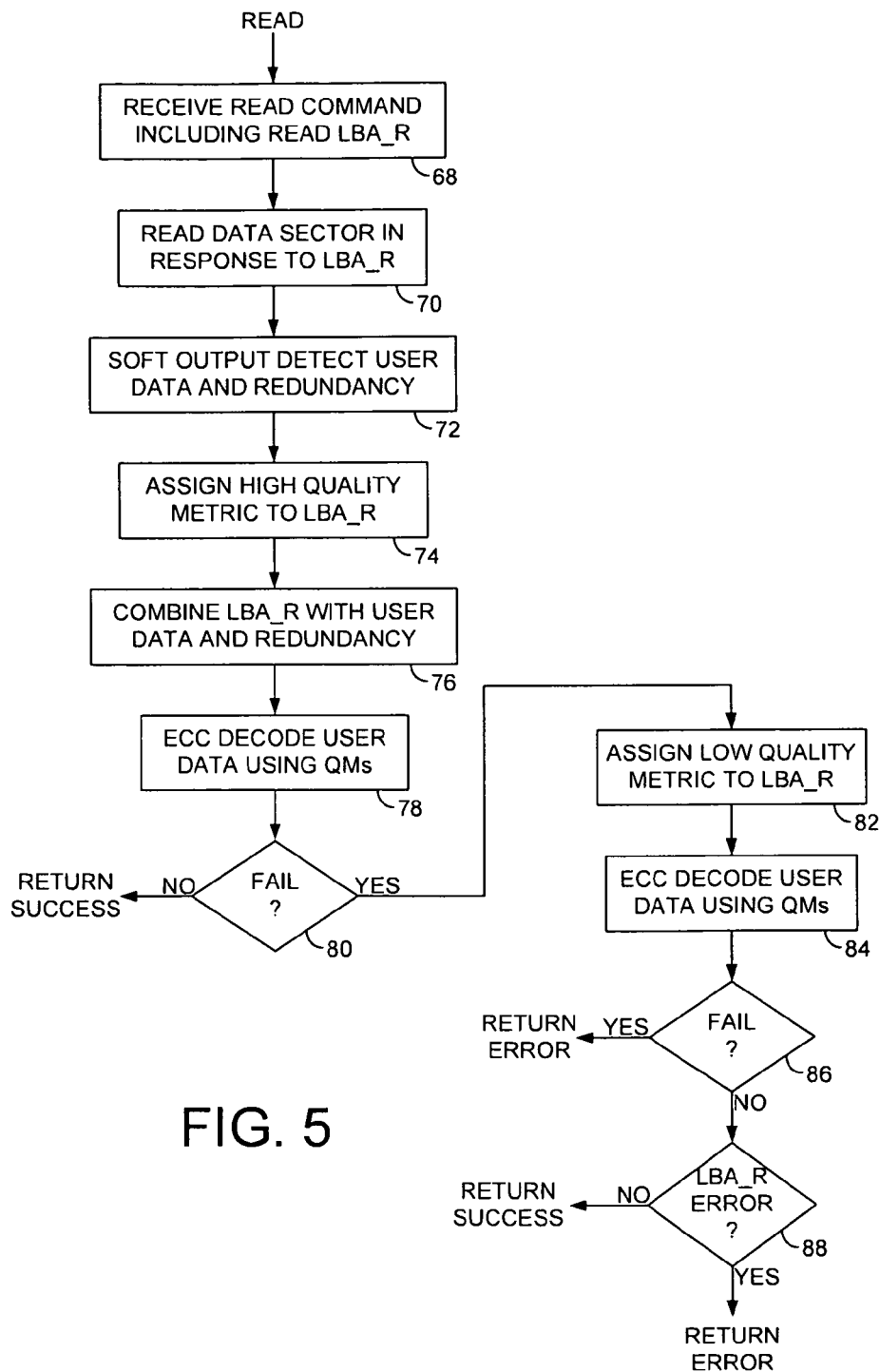
FIG. 5 is a flow diagram according to an embodiment of the present invention wherein if after assigning high quality metrics to the LBA_R the ECC decoding fails, low quality metrics are assigned to the LBA_R and the ECC decoding performed again.

FIG. 5 is a flow diagram according to an embodiment which extends on the flow diagram of FIG. 4B. When the ECC decoding of the user data fails (step 80) using high quality metrics assigned to the LBA_R, it may mean that the LBA_R contains an error. In order to correct this error, low quality metrics are assigned to the LBA_R (step 82) and the user data is decoded again by the ECC decoder using the updated quality metrics (step 84). If the ECC decoding fails again (step 86), an error message is returned to the host. Otherwise if the ECC decoding is successful, but the LBA_R was corrected, it means the LBA_R received from the host did not match the LBA_W of the target data sector, and therefore an error is returned to the host (step 88).

Figure 6:
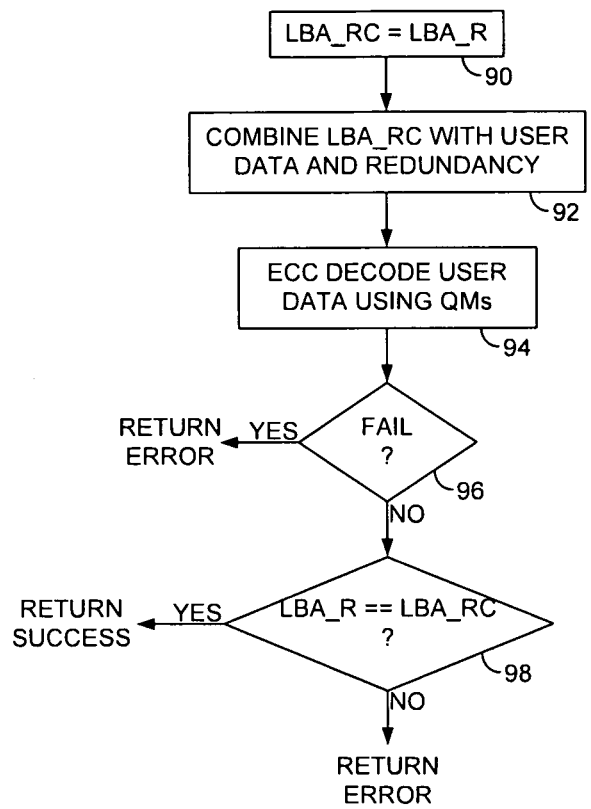
FIG. 6 is a flow diagram according to an embodiment of the present invention wherein an error message is returned to the host if the LBA_R is corrected by the ECC decoder.

FIG. 6 is a flow diagram according to an embodiment of the present invention wherein the LBA_R received from the host during a read operation is copied (step 90) to a codeword placeholder (LBA_RC). The LBA_RC is combined (step 92) with the user data and redundancy data generated by the soft-output detector to form a codeword that is decoded by the ECC decoder using the quality metrics (step 94). If the ECC decoding fails (step 96), an error is returned to the host. Otherwise if the ECC decoding is successful, but the LBA_R received from the host does not match the codeword placeholder (LBA_RC), it means that the LBA_RC was corrected during the ECC decoding and therefore an error is returned to the host (step 98) since the LBA_R does not match the LBA_W.

Any suitable control circuitry may be employed to implement the flow diagrams in the embodiments of the present invention, such as any suitable integrated circuit or circuits. For example, the control circuitry may be implemented within a read channel integrated circuit, or in a component separate from the read channel, such as a disk controller, or certain steps described above may be performed by a read channel and others by a disk controller. In one embodiment, the read channel and disk controller are implemented as separate integrated circuits, and in an alternative embodiment they are fabricated into a single integrated circuit or system on a chip (SOC). In addition, the control circuitry may include a suitable preamp circuit implemented as a separate integrated circuit, integrated into the read channel or disk controller circuit, or integrated into an SOC.

In one embodiment, the control circuitry comprises a microprocessor executing instructions, the instructions being operable to cause the microprocessor to perform the steps of the flow diagrams described herein. The instructions may be stored in any computer-readable medium. In one embodiment, they may be stored on a non-volatile semiconductor memory external to the microprocessor, or integrated with the microprocessor in a SOC. In another embodiment, the instructions are stored on the disk and read into a volatile semiconductor memory when the disk drive is powered on. In yet another embodiment, the control circuitry comprises suitable logic circuitry, such as state machine circuitry.

Although the above embodiments have been described with reference to a disk drive, the aspects of the present invention may be employed within any suitable data storage device comprising any suitable storage medium, such as a magnetic disk of a disk drive, a semiconductor memory of a solid state drive, etc.

What is claimed is:

1. A data storage device comprising control circuitry operable to:
    receive a read command from a host, the read command comprising a read logical block address (LBA_R);
    read a target data sector in response to the LBA_R to generate a read signal;
    process the read signal to detect user data and redundancy data using a soft-output detector that outputs quality metrics QM for the user data and redundancy data;
    assign a high quality metric LBA_QM to the LBA_R; and
    first correct errors in the user data using an error correction code (ECC) decoder in response to the quality metrics QM output by the soft-output detector and the quality metric LBA_QM assigned to the LBA_R.

2. The data storage device as recited in claim 1, further comprising:
    a disk comprising a plurality of data tracks, wherein each data track comprises a plurality of data sectors; and
    a head actuated over the disk.

3. The data storage device as recited in claim 1, wherein the soft-output detector comprises a Viterbi detector.

4. The data storage device as recited in claim 1, wherein the soft-output detector comprises a soft-input-output detector.

5. The data storage device as recited in claim 1, wherein the ECC decoder comprises an iterative ECC decoder.

6. The data storage device as recited in claim 5, wherein the iterative ECC decoder comprises a Low-Density Parity-Check (LDPC) decoder.

7. The data storage device as recited in claim 1, wherein the control circuitry is further operable to:
    receive a write command from the host, the write command comprising user data and a write logical block address (LBA_W);
    generate redundancy data over the user data and the LBA_W; and
    write the user data and the redundancy data to the target data sector.

8. The data storage device as recited in claim 7, wherein the LBA_W is not written to the target data sector.

9. The data storage device as recited in claim 1, wherein when the ECC decoder is unable to first correct the errors in the user data, the control circuitry is further operable to:
    assign a low quality metric LBA_QM to the LBA_R; and
    second correct errors in the user data and the LBA_R using the ECC decoder in response to the quality metrics QM output by the soft-output detector and the quality metric LBA_QM assigned to the LBA_R.

10. The data storage device as recited in claim 9, wherein the control circuitry is further operable to send an error message to the host when the LBA_R is corrected.

11. The data storage device as recited in claim 10, wherein the control circuitry is further operable to detect that the LBA_R was corrected by comparing the LBA_R received from the host to the LBA_R after the second correcting.

12. The data storage device as recited in claim 1, further comprising a non-volatile semiconductor memory comprising a plurality of data blocks, wherein each data block comprises a plurality of data sectors.

13. A method of operating data storage device comprising:
    receiving a read command from a host, the read command comprising a read logical block address (LBA_R);
    reading a target data sector in response to the LBA_R to generate a read signal;
    processing the read signal to detect user data and redundancy data using a soft-output detector that outputs quality metrics QM for the user data and redundancy data;
    assigning a high quality metric LBA_QM to the LBA_R; and
    first correcting errors in the user data using an error correction code (ECC) decoder in response to the quality metrics QM output by the soft-output detector and the quality metric LBA_QM assigned to the LBA_R.

14. The method as recited in claim 13, wherein the data storage device comprises:
    a disk comprising a plurality of data tracks, wherein each data track comprises a plurality of data sectors; and
    a head actuated over the disk.

15. The method as recited in claim 13, wherein the soft-output detector comprises a Viterbi detector.

16. The method as recited in claim 13, wherein the soft-output detector comprises a soft-input-output detector.

17. The method as recited in claim 13, wherein the ECC decoder comprises an iterative ECC decoder.

18. The method as recited in claim 17, wherein the iterative ECC decoder comprises a Low-Density Parity-Check (LDPC) decoder.

19. The method as recited in claim 13, further comprising:
    receiving a write command from the host, the write command comprising user data and a write logical block address (LBA_W);
    generating redundancy data over the user data and the LBA_W; and
    writing the user data and the redundancy data to the target data sector.

20. The method as recited in claim 19, wherein the LBA_W is not written to the target data sector.

21. The method as recited in claim 13, wherein when the ECC decoder is unable to first correct the errors in the user data, further comprising:
    assigning a low quality metric LBA_QM to the LBA_R; and
    second correcting errors in the user data and the LBA_R using the ECC decoder in response to the quality metrics QM output by the soft-output detector and the quality metric LBA_QM assigned to the LBA_R.

22. The method as recited in claim 21, further comprising sending an error message to the host when the LBA_R is corrected.

23. The method as recited in claim 22, further comprising detecting that the LBA_R was corrected by comparing the LBA_R received from the host to the LBA_R after the second correcting.

24. The method as recited in claim 13, wherein the data storage device comprises a non-volatile semiconductor memory comprising a plurality of data blocks, wherein each data block comprises a plurality of data sectors.

\* \* \* \* \*